(12) United States Patent
Miyashita et al.

(10) Patent No.: US 6,354,913 B1
(45) Date of Patent: Mar. 12, 2002

(54) ABRASIVE AND METHOD FOR POLISHING SEMICONDUCTOR SUBSTRATE

(75) Inventors: Naoto Miyashita, Yokohama; Yoshihiro Minami, Fuchu; Kenji Doi; Jun Takayasu, both of Kawasaki; Hiroyuki Kohno, Tokuyama; Hiroshi Kato, Tokuyama; Kazuhiko Hayashi, Tokuyama, all of (JP)

(73) Assignees: Kabushiki Kaisha Toshiba, Kawasaki; Tokuyama Corporation, Tokuyama, both of (JP)

( * ) Notice: Subject to any disclaimer, the term of this patent is extended or adjusted under 35 U.S.C. 154(b) by 0 days.

(21) Appl. No.: 09/214,431

(22) PCT Filed: May 6, 1998

(86) PCT No.: PCT/JP98/02014

§ 371 Date: Jan. 6, 1999

§ 102(e) Date: Jan. 6, 1999

(87) PCT Pub. No.: WO98/50200

PCT Pub. Date: Nov. 12, 1998

(30) Foreign Application Priority Data

May 7, 1997 (JP) .............................................. 9-117045

(51) Int. Cl.⁷ .............................. B24B 1/00; B24B 7/22
(52) U.S. Cl. ............................................. 451/41; 106/3
(58) Field of Search ....................... 451/41, 36; 51/308; 106/3; 510/175

(56) References Cited

U.S. PATENT DOCUMENTS

| | | | |
|---|---|---|---|
| 3,715,842 A | 2/1973 | Tredinnick et al. | |
| 4,169,337 A | * 10/1979 | Payne | 451/41 |
| 4,260,396 A | 4/1981 | Glemza | 51/298 |
| 4,747,954 A | * 5/1988 | Vaughn et al. | 210/670 |
| 5,266,088 A | 11/1993 | Sandusky et al. | 51/298 |
| 5,658,185 A | * 8/1997 | Morgan, III et al. | 451/36 |
| 5,769,689 A | * 6/1998 | Cossaboon et al. | 451/41 |

FOREIGN PATENT DOCUMENTS

| | | |
|---|---|---|
| JP | 2-163130 | 6/1990 |
| JP | 3-86468 | 4/1991 |
| JP | 3-202269 | 9/1991 |
| JP | 5-93183 | 4/1993 |
| JP | 6-93183 | 4/1993 |
| JP | 5-326469 | 12/1993 |
| JP | 8-153696 | 6/1996 |
| JP | 9-199455 | 7/1997 |
| WO | WO 95/08920 | 4/1995 |

\* cited by examiner

Primary Examiner—Robert A. Rose
(74) Attorney, Agent, or Firm—Finnegan, Henderson, Farabow, Garrett & Dunner, L.L.P.

(57) ABSTRACT

A semiconductor wafer or a film formed thereon is polished by using a polishing agent comprising abrasive containing silica particles as the main component, water as a solvent, and a water-soluble cellulose, an alkali metal impurity content of the polishing agent being 5C ppm or less where the polishing agent contains C % by weight of the water-soluble cellulose, so as to flatten the semiconductor wafer without doing damage to the wafer or the film formed thereon and without bringing about a dishing problem in the polished surface.

16 Claims, 8 Drawing Sheets

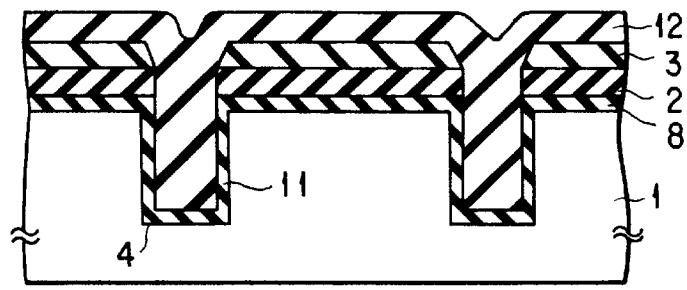
F I G. 3A
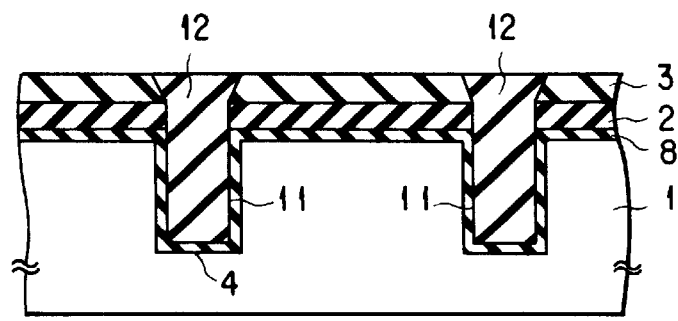
F I G. 3B
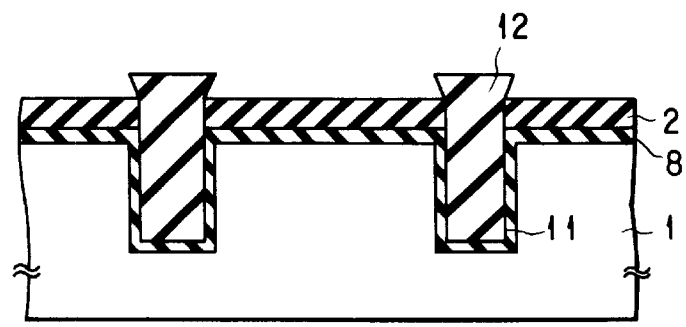
F I G. 3C
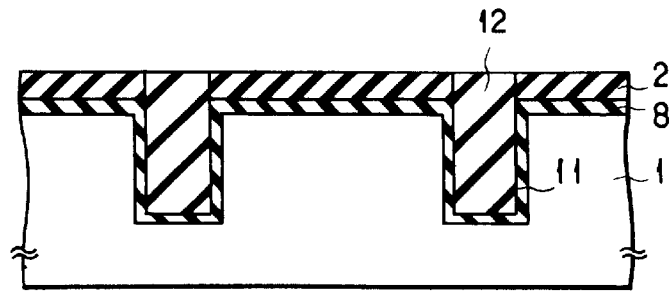
F I G. 3D

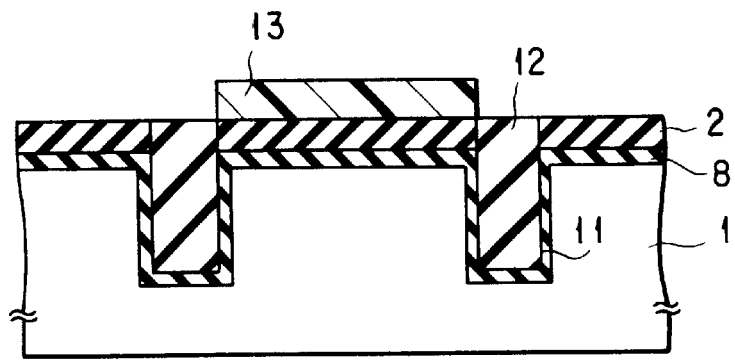
F I G. 3E
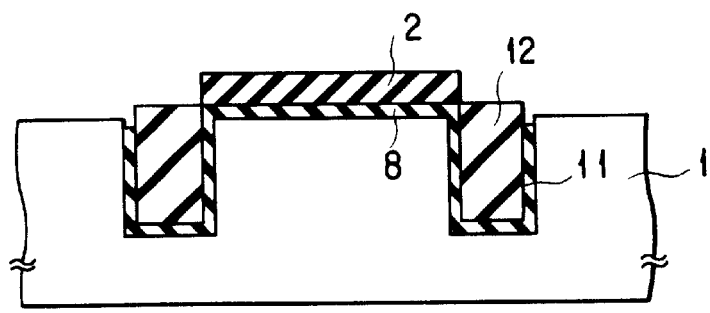
F I G. 3F
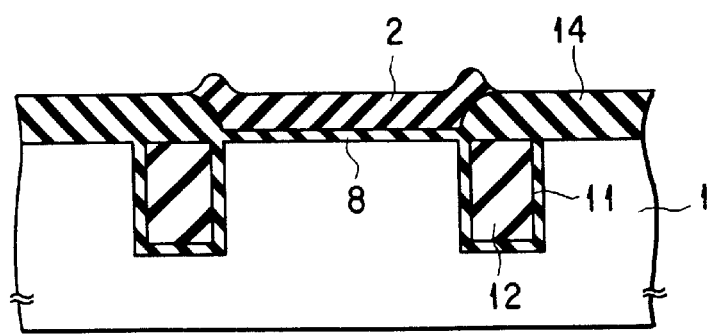
F I G. 3G

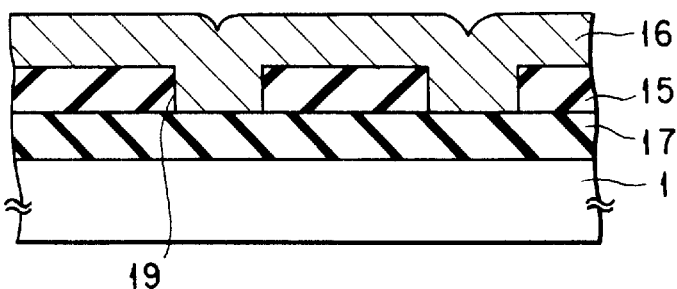
F I G. 4A
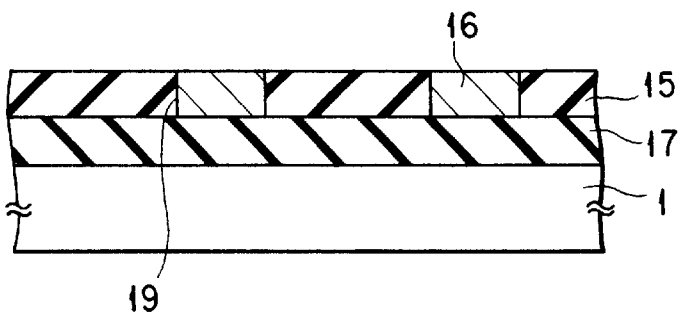
F I G. 4B
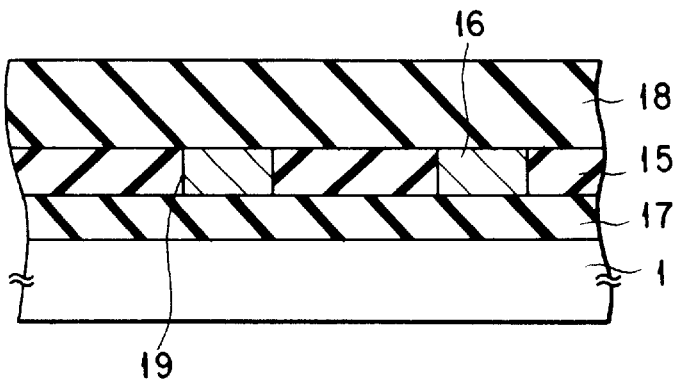
F I G. 4C

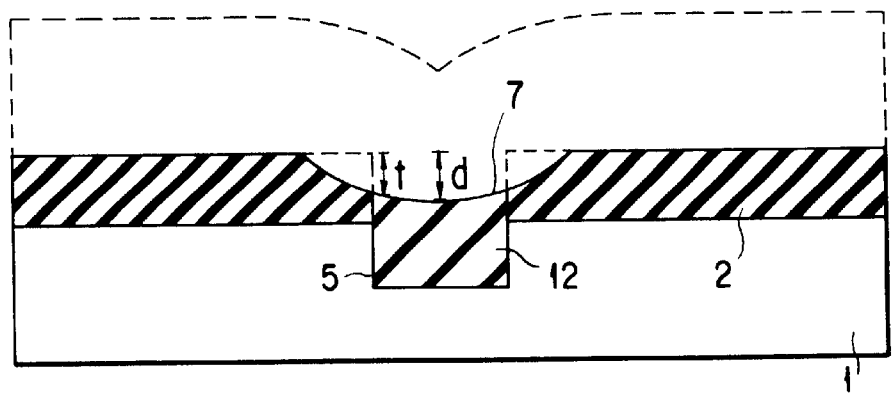
F I G. 7
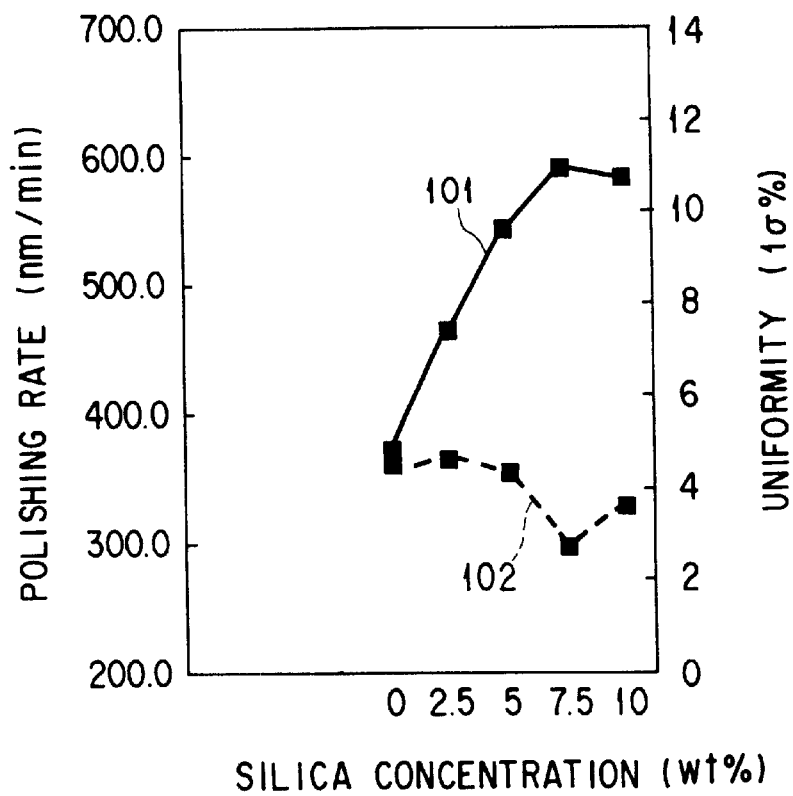
F I G. 8

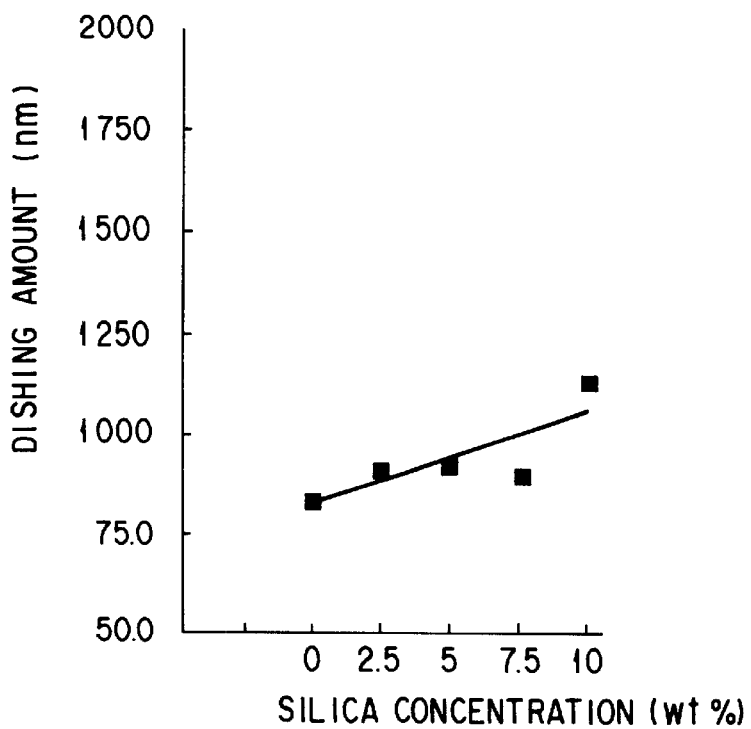
F I G. 9
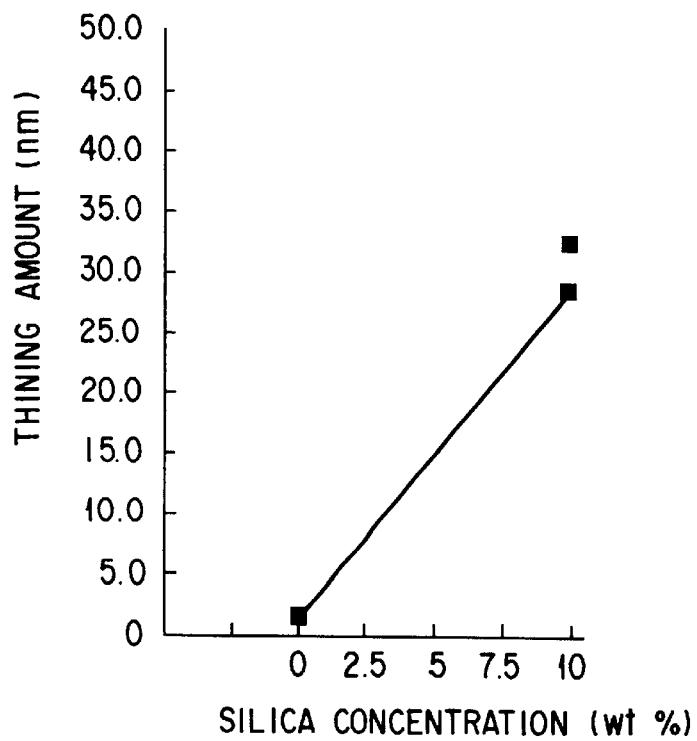
F I G. 10

ABRASIVE AND METHOD FOR POLISHING SEMICONDUCTOR SUBSTRATE

TECHNICAL FIELD

The present invention relates to a polishing agent, particularly, to a polishing agent used for polishing a surface of a semiconductor wafer such as a silicon wafer or used in a CMP (Chemical Mechanical Polishing) method for polishing a film formed on a surface of a semiconductor substrate and to a polishing method using the same.

BACKGROUND ART

It is known to the art to subject a silicon wafer sliced from a silicon ingot to a primary polishing step, a secondary polishing step, etc. while increasing the accuracy of the abrasive, finally reaching a final polishing step.

In the final polishing, it is required to remove substantially completely the irregularity and warping from the wafer surface. Also, in the manufacture of an ULSI in recent years, removal of metal contamination from the wafer (wafer purity) is of high importance with progress in miniaturization of the device. Under the circumstances, it is of high importance to develop a high purity polishing agent which permits polishing of a high precision and which does not impair the purity of the wafer.

U.S. Pat. No. 3,715,842 discloses a polishing agent consisting of an inorganic oxide such as silicon dioxide, a water-soluble cellulose derivative, and an alkali. It is taught that the presence of the water-soluble cellulose is effective for suppressing the polishing damage done to the wafer during the polishing treatment.

The polishing apparatus using the particular polishing agent comprises a polishing cloth stretched on the polishing surface, a polishing disc rotated by, for example, a motor, and a suction disc capable of rotatably supporting a substrate and pressing the rotating substrate against the polishing disc.

In the ordinary method of performing a polishing treatment by using the polishing apparatus, the surface of the rotating substrate which is to be polished is pressed against the polishing cloth on the rotating polishing disc, and a slurry-like polishing agent is applied to the polishing cloth so as to supply the polishing agent between the polishing cloth and the substrate. The polishing technology utilizing the particular polishing apparatus is employed in the manufacture of a semiconductor device, a liquid crystal display device, etc.

In general, a semiconductor device such as an IC or LSI is manufactured via various steps including a designing step for designing an integrated circuit of a semiconductor substrate, a mask preparation step for depicting electron beams used for formation of the integrated circuit, a wafer preparation step for preparing a wafer of a predetermined thickness from a single crystalline ingot, a wafer processing step for forming a semiconductor element such as an integrated circuit on the wafer, an assembling step for separating the wafer into individual semiconductor substrates and for packaging the separated semiconductor substrates to prepare a semiconductor device, and an inspecting step.

In the wafer processing step, an optional material such as a polycrystalline silicon film, a silicon oxide film ($SiO_2$) or a silicon nitride film ($Si_3N_4$) is buried in a groove portion such as a trench or a contact hole, followed by flattening the surface of the buried material. An etch back RIE (Reactive Ion Etching) is known as the flattening method.

However, various problems remain unsolved in the etch back RIE method. For example, the etch back RIE method requires a large number of process steps such as a coating step of an etch back resist. Also, the wafer surface tends to bear a RIE damage, it is difficult to achieve a satisfactory flattening, the manufacturing apparatus is rendered complex because vacuum-based devices are used, and a dangerous etching gas is used.

Such being the situation, the CMP method is being studied in place of the etch back RIE method as a flattening method in the wafer processing step.

A high accuracy is required for the polishing agent used in the CMP method, which is for flattening a surface of a semiconductor device in manufacturing the semiconductor device. Particularly, where the polishing treatment is applied to a silicon wafer itself or a polycrystalline silicon film formed on the wafer, it is proposed to use a polishing agent containing a water-soluble polymer in order to suppress generation of water marks.

Since a clean silicon surface exhibits a water repellency, a silicon or polycrystalline silicon film repels water in the polishing step and the cleaning step so as to form a mass of dust called a water mark. The water mark lowers the cleanliness of the wafer and the yield of the device in some cases. To overcome the problem, a water-soluble polymer is added to the polishing agent so as to form a hydrophilic film on the wafer and, thus, to prevent generation of the water mark.

In general, the polishing agent used for polishing a surface of a substrate, e.g., a silicon wafer, and a film formed on the substrate surface comprises abrasive such as silica particles, water as a solvent, a water-soluble cellulose for forming a hydrophilic film and, as required, a pH controller such as ammonia.

The water-soluble cellulose generally available on the market contains a large amount of alkali metal impurities such as Na, with the result that the wafer is contaminated with Na so as to bring about short-circuiting of the wiring formed on the wafer. To overcome this difficulty, it was customary in the past to suppress the Na content of the polishing agent to about 5 to 10 ppm.

For polishing a substrate or the like, the polishing agent is diluted with a dispersant such as a pure water or an ionic solution. In polishing, for example, a semiconductor wafer, the polishing agent is diluted with the dispersant such that the diluted polishing agent is ½ to ¹⁄₁₀ as thick as the original polishing agent. In polishing a film formed on the semiconductor substrate, the polishing agent is generally diluted such that the diluted polishing agent is about ¹⁄₂₀ as thick as the original polishing agent.

The dispersant used for the dilution is applied through a dispersant nozzle mounted separately from a polishing agent nozzle for applying the polishing agent to the polishing cloth. It follows that the polishing agent is diluted with the dispersant on the polishing cloth.

It is also possible to use two nozzles for applying two kinds of the polishing agents differing from each other in composition to the polishing cloth so as to achieve a desired polishing.

However, some problems are inherent in the conventional polishing agent. In the polishing of, for example, a silicon wafer or a device, the wafer is contaminated with the polishing agent. Where the washing after the polishing is insufficient, the yield of the device tends to be lowered.

Also, even if the addition amount of an alkaline agent is held constant by adding a water-soluble cellulose having the Na content lowered to some extent, the properties of the polishing agent such as a pH value are not made constant, with the result that, where the polishing treatment is carried out repeatedly, the polishing stability, etc. are rendered unsatisfactory.

It should also be noted that an alkaline agent having a high vapor pressure such as ammonia is used in the conventional polishing agent. Naturally, the alkaline agent tends to be evaporated easily, leading to problems in the storing properties of the polishing agent and in the stability of the polishing agent during the storage. Therefore, efforts have been made to develop a high purity developing agent excellent in stability.

Further, used in the conventional polishing apparatus are, for example, silica particles as the abrasive, with the result that an over-polishing tends to take place. Therefore, where a polishing treatment is applied to a CVD oxide film buried in a groove of a semiconductor substrate, an undesired dish-like recess tends to be formed on the surface of the CVD oxide film within the groove. In addition to the dishing problem, a corner portion of the groove of the semiconductor substrate itself tends to be etched. In this case, polycrystalline silicon of $n^+$-type or $p^+$-type or a residual metal tends to remain in a recess in the subsequent process steps, giving rise to problems such as an abnormal resistance of the polycrystalline silicon and short-circuiting of the wiring. Therefore, it is necessary to diminish the amount of the abrasive as much as possible.

DISCLOSURE OF INVENTION

A first object of the present invention, which has been achieved in view of the above-noted problems inherent in the prior art, is to provide a polishing agent which is excellent in stability and preservation capability for each lot and which does not do damage to the substrate or film to be polished.

A second object of the present invention is to provide a method of polishing a semiconductor wafer, which does not do damage to the substrate or film to be polished, which does not bring about non-uniformity among lots, and which permits satisfactory final polishing.

Further, a third object of the present invention is to provide a method of polishing a semiconductor wafer, which permits flattening a film to be polished on a semiconductor substrate by a CMP method without bringing about a dishing problem and a non-uniformity among lots.

The polishing agent of the present invention comprises abrasive containing silica particles as the main component, water as a solvent, and a water-soluble cellulose, and is featured in that, where the polishing agent contains C % by weight of the water-soluble cellulose, an alkali metal impurity content of the polishing agent is 5C ppm or less.

The method of the present invention for polishing a semiconductor wafer comprises a final polishing step which is carried out by applying a polishing agent to a polishing surface of a semiconductor wafer sliced from an ingot and subjected to a polishing treatment several times, said polishing agent comprising abrasive containing silica particles as the main component, water as a solvent, and a water-soluble cellulose, an alkali metal impurity content of the polishing agent being 5C ppm or less where the polishing agent contains C % by weight of the water-soluble cellulose.

The other method of the present invention for polishing a semiconductor wafer comprises a chemical mechanical polishing step which is carried out by supplying a polishing agent onto a film formed on the semiconductor wafer, said polishing agent comprising abrasive containing silica particles as the main component, water as a solvent, and a water-soluble cellulose, an alkali metal impurity content of the polishing agent being 5C ppm or less where the polishing agent contains C % by weight of the water-soluble cellulose.

In the polishing agent of the present invention, the alkali metal content of the water-soluble cellulose is controlled at a low value, with the result that the purity of the wafer after the polishing treatment is not lowered.

It should also be noted that abrasive are used in the polishing agent of the present invention in combination with the water-soluble cellulose having the alkali metal content controlled at a low value. As a result, the polishing agent is free from non-uniformity among lots, exhibits excellent stability in properties, particularly, in pH value, and permits achieving a stable polishing free from non-uniformity.

The polishing agent of the present invention, which is adapted for use in a final polishing of a wafer such as a silicon semiconductor wafer, permits polishing the wafer without giving rise to water mark formation. Also, in the case of polishing a film formed on a wafer, the film can be polished without bringing about a dish-like recess on the polished film surface.

BRIEF DESCRIPTION OF DRAWINGS

FIGS. 3A to 3G are cross sectional views collectively showing a polishing step.

FIGS. 4A to 4C are cross sectional views collectively showing a process of forming a Cu wiring.

FIG. 7 is a cross sectional view schematically showing a cross section of a semiconductor substrate after a CMP treatment.

FIG. 8 is a graph showing the relationship among the silica concentration, the polishing rate (nm/min), and the uniformity ($1\sigma\%$) of the polished film.

FIG. 9 is a graph showing the relationship between the silica concentration and the dishing amount.

FIG. 10 is a graph showing the relationship between the silica concentration and the thinning amount.

BEST MODE OF CARRYING OUT THE INVENTION

Figure 1:
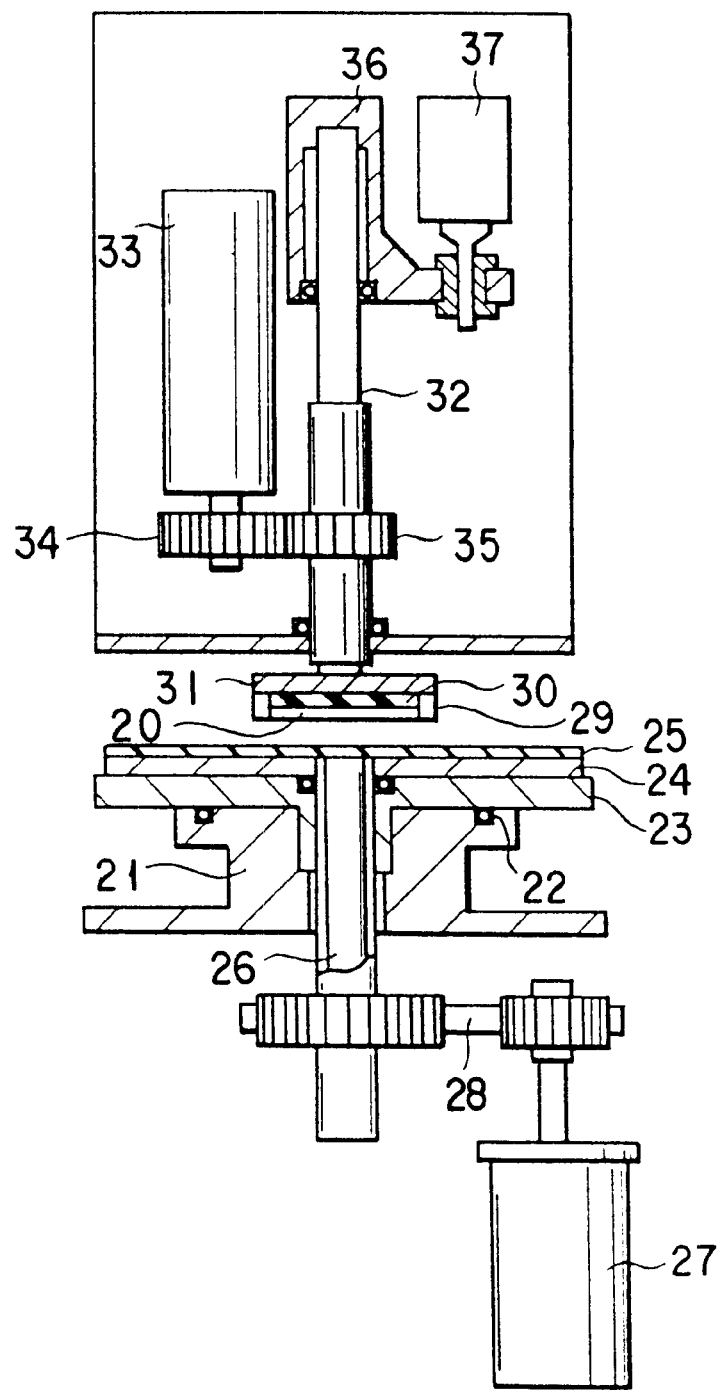
FIG. 1 schematically shows a polishing apparatus in which the polishing agent of the present invention can be used.

The present inventors have conducted an extensive research in an attempt to achieve the object of the present invention. As a result, it has been found that, where the polishing agent contains a water-soluble cellulose which produces a significant effect of suppressing the water mark formation, the polishing agent contains a large amount of an alkali metal such as sodium because such an alkali metal is contained in the water-soluble cellulose in a large amount, giving rise to the serious problems pointed out previously.

Thus, the water-soluble cellulose was refined so as to remove the alkali metal to a predetermined level and, thus, to drastically improve the purity of the polishing agent. The present inventors have also found that the contamination of the silicon wafer and the semiconductor device can be markedly suppressed by using the polishing agent of the high purity, arriving at the present invention.

The polishing agent of the present invention comprises abrasive containing silica particles as the main component, water, and a water-soluble cellulose, and is featured in that, where the water-soluble cellulose content of the polishing agent is C % by weight, the alkali metal impurity content is set at 5C ppm or less.

The polishing method of a semiconductor wafer according to the present invention comprises a final polishing step in which the above-noted polishing agent is applied to the polishing surface of a semiconductor wafer sliced from an ingot and subjected in advance to a polishing treatment several times.

Further, the present invention provides a polishing method of a semiconductor wafer, comprising the step of applying a chemical mechanical polishing treatment to a film formed on a semiconductor substrate, while applying the above-noted polishing agent onto the film, so as to flatten the surface of the film.

The water-soluble cellulose used in the present invention is not particularly limited. In other words, it is possible to use known cellulose including, for example, water-soluble cellulose such as methyl cellulose, methyl hydroxyethyl cellulose, methyl hydroxypropyl cellulose, hydroxyethyl cellulose, hydroxypropyl cellulose, and a derivative thereof.

The water-soluble cellulose mainly serves to suppress the damage done to the wafer in the polishing step and to form a hydrophilic film on the wafer. Among the water-soluble cellulose materials exemplified above, hydroxyethyl cellulose is likely to form a hydrophilic film easily and, thus, is desirable.

The amount of the water-soluble cellulose, which is dependent on the molecular weight, etc. of the cellulose, may be 0.05 to 4% by weight, preferably 0.1 to 1% by weight, and more preferably 0.1 to 0.5% by weight, based on the total amount of the polishing agent. If the amount is less than 0.05% by weight, it is difficult to form a uniform hydrophilic film. On the other hand, if the amount exceeds 4% by weight, the viscosity of the polishing agent is excessively increased so as to make it difficult to handle the polishing agent smoothly depending on the molecular weight, etc. of the water-soluble cellulose used.

The present inventors have found that metals, particularly alkali metals, are contained in an unexpectedly large amount in the water-soluble cellulose available on the market. These alkali metals cause serious problems. For example, the purity of the silicon wafer is lowered when the wafer is polished with the polishing agent containing a large amount of an alkali metal. Also, the properties of the polishing agent such as a pH value are impaired by the presence of the alkali metal. Incidentally, the water-soluble cellulose available on the market contains thousands to scores of thousands of ppm of an alkali metal impurity such as Na. Also, since the content of the alkali metal impurity widely differs depending on the lot of the water-soluble cellulose, it is difficult to manufacture a polishing agent of a constant quality.

As described above, the water-soluble cellulose contains a large amount of alkali metal impurities. It should be noted in this connection that pulp or cotton is used as a raw material in preparing a water-soluble cellulose. To be more specific, the raw material pulp or cotton is treated first with caustic soda to form an alkali cellulose, followed by allowing ethylene oxide or the like to react with the alkali cellulose so as to obtain a water-soluble cellulose. However, since the impurities, particularly Na or the like, cannot be removed completely by the washing, the alkali metal remains in the obtained water-soluble cellulose.

Several measures for removing the impurities from the water-soluble cellulose have been proposed to date. For example, Japanese Patent Disclosure (Kokai) No. 53-102393 teaches that glyoxal is bonded to hydroxyethyl cellulose to make the cellulose insoluble temporarily, followed by washing the insoluble cellulose and, then, breaking the crosslinkage so as to bring the insoluble cellulose back to hydroxyethyl cellulose. However, it is difficult to remove completely the impurities such as Na by such a water-wash. Also, Japanese Patent Disclosure No. 62-32101 teaches that hydroxyethyl cellulose is treated with an organic solvent containing an acidic alkyl phosphate ester or with a mixed solvent consisting of the organic solvent and water so as to remove alkali metals from the cellulose. Further, Japanese Patent Disclosure No. 50-83427 teaches that hydroxyethyl cellulose containing sodium acetate as an impurity is refined by using a cation exchange resin to remove the sodium ions alone from sodium acetate. In this example, the cation exchange resin alone is used. However, ammonium hydroxide is further added in JP '427 to allow the resultant ammonium acetate to prevent fungi generation.

The method for removing the alkali metal from the aqueous solution of the water-soluble cellulose is not particularly limited in the present invention. For example, the alkali metal can be removed in the present invention by bringing an aqueous solution of a water-soluble cellulose into contact with each of an H-type ion exchange resin and an OH-type ion exchange resin. By using both the H-type and OH type ion exchange resins, the cellulose purity can be markedly increased so as to remove not only metal ions such as Na ions but also anions other than hydroxyl ions. It is also possible to employ as required the conventional method of removing the impurities from the water-soluble cellulose in combination with the method using ion exchange resins.

In the present invention, it is desirable to remove not only the metal ions such as Na ions but also anions other than hydroxyl ions in refining the water-soluble cellulose, as described above. It should be noted that, where anions other than hydroxyl ions are present, the aqueous solution of the water-soluble cellulose is rendered acidic. As a result, the addition amount of a water-soluble amine required for the pH control fails to be constant. Also, the pH value is changed for each lot, resulting in failure to obtain a polishing agent of a constant quality.

Where the aqueous solution of a water-soluble cellulose is treated with an ion exchange resin, the cellulose concentration of the aqueous solution, which depends on the molecular weight of the specific cellulose used, should be 0.05 to 4% by weight, preferably 0.1 to 1% by weight. Also, the viscosity of the aqueous solution of the water-soluble cellulose should be 5 to 1,000 cP, preferably 10 to 300 cP, in order to facilitate the ion exchange treatment. The aqueous solution of the water-soluble cellulose after the ion exchange treatment can be diluted with pure water. By contraries, the particular aqueous solution can be condensed or dried.

As described above, the concentration of the water-soluble cellulose can be controlled appropriately to conform with an optional final concentration adapted for the polishing apparatus.

The aqueous solution of the water-soluble cellulose can be brought into contact with an H-type ion exchange resin and an OH-type ion exchange resin separately or with a mixture of the H-type and OH-type ion exchange resins.

Also, the particular contact can be performed by a batch system or a circulation system. For example, it is desirable to supply an aqueous solution of the water-soluble cellulose at a predetermined speed in one direction through a resin layer loaded with a mixture of an H-type ion exchange resin and an OH-type ion exchange resin.

Incidentally, fine particles can be removed from the aqueous solution of the water-soluble cellulose subjected to the ion exchange treatment by means of, for example, filtration. The pore size of the filter used for filtration should be 50 $\mu$m or less, preferably 10 $\mu$m or less, and more preferably 1 $\mu$m or less. It is desirable to use the filtered water-soluble cellulose in the polishing agent of the present invention because the amount of the dust remaining on the wafer after the polishing treatment can be decreased.

The alkali metal content of the water-soluble cellulose used in the present invention can be decreased by the refining treatment described above to 5 ppm or less where the water-soluble cellulose concentration is C % by weight.

Preferably, the pH value of the polishing agent of the present invention is controlled by using a pH controller.

The pH controller is added to put the polishing agent of the present invention on the alkali side so as to promote the polishing function. Also, where the polishing agent contains silica, the pH controller is added to set the pH value in the polishing step at 8 or more so as to prevent agglomeration of silica and water-soluble cellulose.

To be more specific, the pH value of the polishing agent in the polishing step should be controlled at 8 to 11, preferably 9 to 10.5, and more preferably 9.5 to 10.3. If the pH value is less than 8, a sufficient polishing rate cannot be obtained. Also, a gelling reaction tends to take place between the water-soluble cellulose and silica. On the other hand, if the pH value exceeds 11, the wafer surface tends to be roughened.

The pH controller should desirably have a vapor pressure of 133 Pa or less at 20° C. A water-soluble amine is used as a desirable pH controller. In the case of using a water-soluble amine having a vapor pressure of 133 Pa or less, the preservation capability of the polishing agent can be improved. Also, the polishing stability can be improved. The pH controller having a vapor pressure higher than 133 Pa tends to be evaporated easily from the polishing agent, with the result that the functions of improving the preservation capability of the polishing agent and improving the polishing stability tend to be lowered together with purity of the water-soluble cellulose.

The typical examples of the water-soluble amine used in the present invention include, for example, diethanol amine, triethanolamine, diethylene triamine, triethylene tetramine, tetraethylene pentamine, pentaethylene hexamine, triethylene diamine, 2-aminoethanol, polyethylene imine, and aminoethyl ethanolamine. It is also possible to use a mixture of at least two of these amines. The mixture may contain 20% by weight or less of an additional alkali agent which does not contain an alkali metal, e.g., ammonia and an amine having a relatively high vapor pressure.

The amount of the water-soluble amine is not particularly limited, as far as the performance of the polishing agent can be maintained. Generally, the amine amount is selected appropriately from within a range of 0.1 to 20% by weight so as to achieve a desired pH value, i.e., 8 to 11, of the polishing agent in the polishing step. Incidentally, a high importance is not placed on the polishing rate in the final polishing agent. Therefore, a water-soluble amine having a weak basicity tends to be excellent in preservation capability and polishing function when used in a polishing agent.

Among the water-soluble amines exemplified above, triethanolamine, which has a very low vapor pressure and a relatively low basicity, is excellent in preservation capability and polishing function when used in a polishing agent. In the case of using triethanolamine as a water-soluble amine, it is desirable to use triethanolamine in a relatively large amount. Specifically, triethanolamine should preferably be added in an amount of 1 to 15% by weight, more preferably 3 to 10% by weight, based on the total amount of the polishing agent.

It is desirable to use silica of a high purity. The typical silica used in the present invention includes a colloidal silica prepared by hydrolyzing alkoxy silane used as a raw material. It is relatively easy to decrease all the metal impurity content other than silicon of the colloidal silica to 1 ppm or less. An average particle diameter of the primary silica particles, which can be measured by, for example, an electron microscope, should be 10 to 100 nm, more preferably 30 to 60 nm. On the other hand, an average particle diameter of the secondary silica particles, which can be measured by, for example, a particle size analyzer, should be 20 to 200 nm, preferably 30 to 120 nm. The particle size distribution of the silica particles should desirably be narrow, though it is acceptable for the distribution to have a certain width. Also, the silica particles should not contain coarse particles having a diameter of 500 nm or more, preferably 200 nm or more.

In the present invention, it is also possible to use fumed silica prepared by burning silicon tetrachloride within a flame consisting of oxygen and hydrogen. The fumed silica, which can be formed at a high purity depending on the manufacturing method, can be suitably used in the present invention. Some fumed silica available on the market, which contains 1 ppm or less of metal other than silicon, can also be used in the present invention. Presently, it is possible to manufacture fumed silica having a specific surface area of 50 to 500 m$^2$/g. In the present invention, it is desirable to use fumed silica having a specific surface area of 200 m$^2$/g or more. Where fumed silica is used in the polishing agent of the present invention, it is desirable for the silica particles to be finely dispersed in the polishing agent.

To allow silica to produce its effect sufficiently, the silica content of the polishing agent of the present invention should be 0.1 to 50% by weight, preferably 5 to 20% by weight.

In the present invention, the alkali metal content of the polishing agent is controlled by controlling the alkali metal content of the water-soluble cellulose and the purity of the silica particles such that the alkali metal content is set at 5C ppm or less where the concentration of the water-soluble cellulose is C % by weight.

Also, the reproducibility and stability of the polishing agent can be made satisfactory in the case of using a water-soluble amine as a pH controller, too, by setting the alkali metal content at 5C ppm or less.

In the polishing agent of the present invention, it is important to control the alkali metal elements as described above. In addition, it is also desirable to control metal elements other than the alkali metal elements and anions other than OH ions. It should be noted that an alkali metal such as Na is contained in the cellulose. In addition, anionic impurities are also contained in the cellulose. Incidentally, anionic impurities such as 35.3 ppm of NO$_3^-$ and 7.9 ppm of PO$_4^{3-}$ are detected in the non-refined cellulose solution. These anionic impurities affect the pH value of the polishing agent like cationic impurities such as an alkali metal element. If a large amount of cationic impurities or anionic impurities are present, a large non-uniformity in pH value is brought about among lots of the polishing agent, leading to non-uniformity in the polishing rate.

In general, the cationic impurities contained in the polishing agent include ions of metals such as Zn, Pb, Ni, Co, Fe, Cr, Mg, Cu, Ag, Ti, Ca and Al in addition to the alkali metal elements described previously. On the other hand, the anionic impurities contained in the polishing agent include $NO_3^-$, $PO_4^{3-}$, $F^-$, $Cl^-$, $Br^-$ and $SO_4^{2-}$.

In the present invention, it is important to set the alkali metal content at 5C ppm or less where the concentration of the water-soluble cellulose is set at C % by weight. In order to prevent the non-uniformity in the polishing rate of the polishing agent, it is desirable to set the cationic impurity content including the ions of the alkali metals and metals other than the alkali metals at 5C ppm or less. Further, it is desirable to set the anionic impurity content at 5C ppm or less.

By controlling the cationic impurity content and the anionic impurity content at the values given above, it is possible to obtain a polishing agent small in non-uniformity of the pH value and in the polishing rate among lots.

Use of the polishing agent of the present invention is not particularly limited and can be used in, for example, a chemical mechanical polishing.

The polishing agent of the present invention is used at the composition described previously in the polishing step. However, in order to facilitate the handling of the polishing agent, it is desirable to increase the concentration of the effective components of the polishing agent by 2 to 20 times by controlling the solvent concentration when the polishing agent is put on the market.

When the polishing agent of the high concentration is actually used, it is desirable to dilute the polishing agent with pure water so as to prevent alkali metals from entering the diluted polishing agent.

Also, where the polishing agent of the present invention is used for polishing, for example, a substrate, the polishing agent is diluted with a dispersant such as pure water or ionic solution. In polishing, for example, a semiconductor wafer, the polishing agent is diluted such that the diluted polishing agent is ½ to ¹⁄₁₀ as thick as the polishing agent before dilution. In polishing a film formed on a semiconductor substrate, the polishing agent is diluted such that the diluted polishing agent is about ¹⁄₂₀ as thick as the polishing agent before dilution. In other words, the polishing agent is diluted such that the diluted polishing agent is ½ to ¹⁄₂₀ as thick as the polishing agent before dilution. In order to dilute the polishing agent, the polishing agent and the dispersant are supplied simultaneously through a nozzle for the polishing agent and another nozzle for the dispersant onto the semiconductor wafer arranged on a polishing disc.

The concentration of the water-soluble cellulose in the step of polishing a substrate with the diluted polishing agent should be 0.0025 to 0.8% by weight, preferably 0.005 to 0.2% by weight, and more preferably 0.005 to 0.1% by weight. The concentration of the water-soluble amine, which is added to the polishing agent, should be 0.005 to 4% by weight, preferably 0.05 to 3% by weight, and more preferably 0.15 to 2% by weight. On the other hand, the silica content should be 0.005 to 10% by weight, preferably 0.25 to 4% by weight.

According to a preferred embodiment of the present invention, provided is a polishing agent comprising 0.1 to 50% by weight of silica-based abrasive, water as a solvent, 0.05 to 4% by weight of a water-soluble cellulose, and 0.1 to 20% by weight of a water-soluble amine having a vapor pressure at 20° C. of 133 Pa or less, wherein the content of alkali metal impurities is 5C ppm or less where the concentration of the water-soluble cellulose is set at C % by weight.

According to a preferred embodiment of the present invention, a water-soluble cellulose having the alkali metals removed to a predetermined level and an amine specified as a pH controller are used in combination so as to markedly improve the preservation capability, uniformity among lots, and polishing stability of the polishing agent.

Further, according to a preferred embodiment of the present invention, the silica content should desirably be 5 to 20% by weight, the concentration of the water-soluble cellulose should desirably be 0.1 to 1% by weight, more desirably 0.1 to 0.5% by weight, and the amount of the water-soluble amine which is added to the polishing agent should desirably be 1 to 15% by weight, more desirably 3 to 10% by weight.

In performing a CMP by using the polishing agent of the present invention, it is possible to dilute the polishing agent with a dispersant such as an ionic solution. It is appropriate to set the viscosity of the polishing agent at 1 to 10 cP.

The polishing agent of the present invention comprises abrasive such as silica particles, water as a solvent, a water-soluble cellulose forming a hydrophilic film and, as desired, a pH controller such as a water-soluble amine. Sodium is contained as an impurity in the water-soluble cellulose in an amount of 0.05 to 1 ppm.

In the polishing method of the present invention, it is desirable to use a polishing agent of the present invention in combination with another polishing agent differing in composition from the polishing agent of the present invention. In this case, the polishing agent of the present invention and the other polishing agent are supplied through different nozzles onto a semiconductor wafer supported by a polishing disc.

FIG. 1 schematically shows a polishing apparatus in which the polishing agent of the present invention can be used for polishing a semiconductor wafer such as a silicon wafer and a film formed on the wafer.

As shown in FIG. 1, a polishing disc receptacle 23 is arranged on a stage 21 with a bearing 22 interposed therebetween. A polishing disc 24 is mounted on the receptacle 23. A polishing cloth 25 for polishing, for example, a semiconductor wafer is stretched over the polishing disc 24. Further, a driving shaft 26 for rotating the polishing disc receptacle 23 and the polishing disc 24 is arranged in a central portion. The driving shaft 26 is rotated by a motor 27 via a rotating belt 28. On the other hand, a suction cloth 30 is mounted by vacuum suction or water sealing to a suction disc 31 and a template 29 arranged to face the polishing cloth 25. A wafer 20 is mounted to the suction cloth 30. The suction disc 31 is connected to the driving shaft 32. Also, the driving shaft 32 is rotated by a motor 33 via gears 34 and 35. The driving shaft 32 is fixed to a driving support 36. The driving support 36 is mounted to a cylinder 37 so as to be moved up and down in accordance with the vertical movement of the cylinder 37. The polishing agent of the present invention is supplied to a clearance between the wafer 20 fixed to the suction disc 31 and the polishing cloth 25 so as to polish the wafer 20.

Let us describe with reference to FIGS. 2A to 2E how to polish a film formed on a semiconductor substrate by using the polishing apparatus shown in FIG. 1. Specifically, FIGS. 2A to 2E are cross sectional views collectively showing an element isolation process in which groove portions are formed in a silicon substrate, followed by filling the groove portions with CVD oxide films and subsequently flattening the CVD oxide films by using a polishing apparatus.

In the first step, a silicon nitride film 2, which is used as a stopper film in polishing an oxide film formed later, is formed on a silicon substrate 1 in a thickness of about 70 nm.

Then, a CVD oxide film used as a mask in the step of forming a groove portion is deposited on the silicon nitride film 2.

Photoresist (not shown) is coated on the entire surface of the CVD oxide film for patterning a mask and a stopper, followed by patterning the photoresist. Then, the CVD oxide film and silicon nitride film 2 are selectively removed by means of, for example, a RIE method using the patterned photoresist as a mask. Then, a groove portion 5 is formed in the silicon substrate 1 by, for example, a RIE method using the patterned CVD oxide film and the silicon nitride film 2 as a mask. After formation of the groove portion 5, a wet treatment is applied to the substrate so as to remove the CVD oxide film, the reaction product in the step of RIE, and the damaged layer.

In the next step, a CVD oxide film 6 or a BPSG film is formed on the silicon nitride film 2 and the groove portion 5, as shown in FIG. 5B. The CVD oxide film 6 is polished by the polishing apparatus shown in FIG. 1. The polishing agent of the present invention is used in this polishing apparatus. Silicon nitride particles are dispersed in a colloidal state in the polishing agent so as to permit the nitride particles to be dispersed uniformly in the polishing agent. It is appropriate to set the viscosity of the polishing agent at 1 to 10 cP. If the viscosity is unduly low, it is difficult to disperse uniformly the abrasive. Also, if the viscosity is unduly high, the mechanical polishing properties are rendered strong, with the result that the warping of the wafer and the uniformity of the film thickness greatly affect the uniformity after the CMP step. It follows that it is difficult to obtain a high uniformity.

Figure 2A:
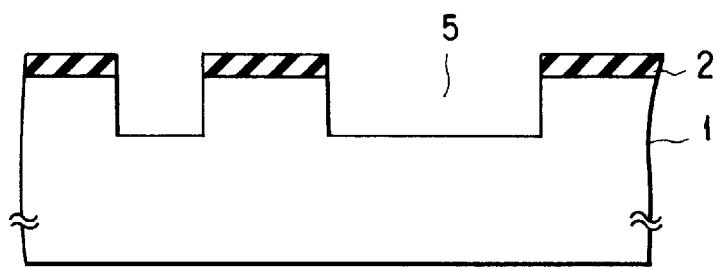
FIGS. 2A to 2E are cross sectional views collectively showing a process of manufacturing a semiconductor device.
Figure 2B:
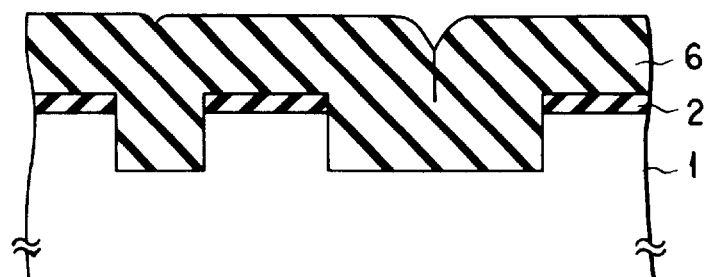
Figure 2C:
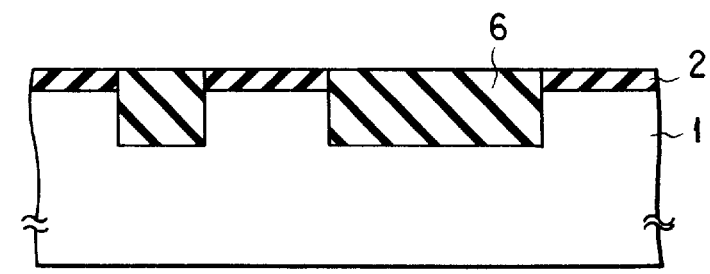

It is desirable to perform the polishing treatment at 20 to 70° C. If the polishing treatment is performed at a high temperature, a chemical function is rendered strong. During the polishing treatment, the wafer is pressed against the polishing cloth 25 on the polishing disc 24 which is rotated at about 100 rpm. The rotating speed of the polishing disc 24 falls within a range of between 20 and 200 rpm, and the pressing force of the wafer against the polishing cloth is 50 to 500 g/cm². FIG. 2C shows the flattened state after the polishing of the CVD oxide film 6.

Figure 2D:
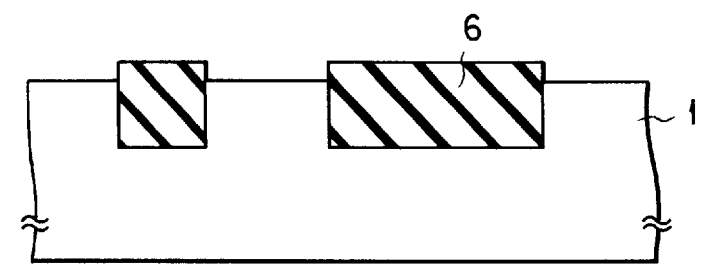
Figure 2E:
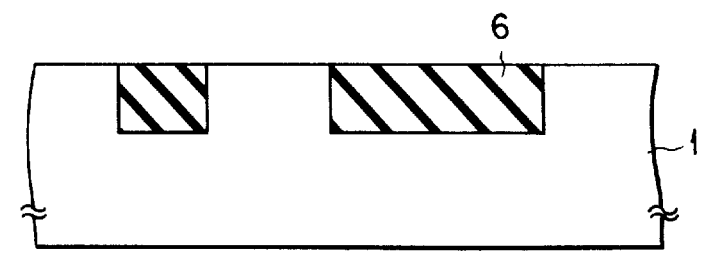

In the next step, the silicon nitride film 2 acting as a stopper film is removed by etching, as shown in FIG. 2D. Then, a final polishing is performed so as to make the surface of the silicon wafer 1 flush with the surface of the CVD oxide film 6, as shown in FIG. 2D. After the final polishing treatment, the surface of the silicon wafer 1 and the buried CVD oxide film 6 is free from the dishing (dish-like recess).

FIGS. 3A to 3G are cross sectional views covering a case where a polycrystalline silicon is buried in a groove portion formed in a semiconductor substrate.

In the first step, a buffer oxide film (SiO₂) 8 is formed by thermally oxidizing a surface region in a depth of about 10 to 50 nm of a main surface of a silicon substrate 1. Then, a silicon nitride film 2 is deposited on the buffer oxide film 8 in a thickness of about 70 nm, followed by depositing a CVD oxide film 3, which is used as a mask in forming a groove portion, on the silicon nitride film 2. The silicon nitride film 2 is used as a stopper film in polishing a second polycrystalline silicon film and serves to protect an element region.

Further, in order to pattern a mask and the silicon nitride film, the entire surface of the CVD oxide film 3 is coated with photoresist, followed by patterning the photoresist layer. Then, the CVD oxide film 3 and the silicon nitride film 2 acting as a stopper film are selectively removed simultaneously by, for example, RIE using the patterned photoresist film as a mask so as to form a groove portion 7 in the silicon wafer 1. After formation of the groove portion, the reaction product in the RIE step and the damaged layer are removed by a wet treatment, followed by oxidizing the inner surface of the groove portion so as to form an oxide film 11. Further, a polycrystalline silicon film 12 is deposited within the groove portion and on the CVD oxide film 3 by, for example, a reduced pressure CVD, as shown in FIG. 3A.

In the next step, a first polishing treatment is applied to the polycrystalline silicon film 12 by using the polishing apparatus shown in FIG. 1. In the first polishing treatment, the CVD oxide film 3 is used as a stopper film. By this first polishing treatment, the polycrystalline silicon film 12 is flattened, as shown in FIG. 3B.

After the first polishing treatment, the CVD oxide film 3 is etched by using an etchant containing HF, as shown in FIG. 3B. As apparent from the drawing, the polycrystalline silicon film 12 protrudes from the silicon wafer 1 as a result of removal of the CVD oxide film 3.

In the next step, a second polishing treatment is applied to the protruding polycrystalline silicon film 12 by using the polishing apparatus shown in FIG. 1. The polishing agent used in the second polishing treatment is equal to that used in the first polishing treatment. By the second polishing treatment, the upper surface of the polycrystalline silicon film 12 is made flush with the upper surface of the silicon nitride film 2, as shown in FIG. 3D. As a result, the polycrystalline silicon film 12 is buried in the groove portion without bringing about a dishing problem. It should be noted that a part of the silicon nitride film 2 is used as a mask for LOCOS. Therefore, a photoresist layer 13 is formed via a photolithography step on the particular portion of the silicon nitride film 2, as shown in FIG. 3E.

Further, that region of the silicon nitride film 2 which is not covered with the photoresist layer 13 is removed by, for example, RIE, followed by removing the photoresist layer, as shown in FIG. 3F. Then, a heat treatment is applied to the surface of the silicon wafer 1 so as to have the surface of the silicon wafer 1 covered with a LOCOS oxide film 14, as shown in FIG. 3G. The peripheral portion of the LOCOS mask is made thin by over-polishing to form a bird's beak. In this case, however, the bird's beak is formed smaller than in the prior art, with the result that the device characteristics are not seriously affected by the reduction of the area caused by the bird's beak formation.

In the present invention, a satisfactory flat surface as shown in FIG. 3D can be obtained by the use of a polishing agent of a novel construction. As a result, it is possible to obtain a satisfactory worked shape free from a difference in the LOCOS pattern conversion, as shown in FIG. 3G.

FIGS. 4A to 4C are cross sectional views collectively showing how to form a buried Cu wring on a semiconductor substrate by using the polishing apparatus shown in FIG. 1.

In the first step, a CVD oxide film 17 consisting of, for example, SiO₂ is formed on a semiconductor substrate 1, followed by forming a plasma oxide film 15 on the CVD oxide film 17. The plasma oxide film 15 is formed by a plasma CVD and consists of, for example, $SiO_2$. Then, the plasma oxide film 15 is patterned to form groove portions 19 at predetermined portions of the semiconductor substrate 1, followed by depositing a Cu film 16 within the groove portions 19 and over the entire surface of the plasma oxide film 15, as shown in FIG. 4A.

In the next step, the Cu film 16 is polished by using the polishing apparatus shown in FIG. 1 with the plasma oxide film 15 used as a stopper film. When the plasma oxide film 15 is exposed to the outside, the polishing of the Cu film 16 is finished. By this treatment, the Cu film alone is buried in the groove portion to form a buried Cu wiring 16, as shown in FIG. 4B.

Then, a plasma oxide ($SiO_2$) film 18 is formed to cover the plasma oxide film 15 and the Cu film 16, as shown in FIG. 4C.

By the polishing treatment described above, a flat surface of the semiconductor substrate 1 free from the dishing problem can be obtained. Also, the second plasma oxide film ($SiO_2$) 18 can be form ed easily. Further, a second and third wiring layers (not shown) can be formed easily by the flattening performed by the CMP method.

In this embodiment, a plasma CVD $SiO_2$ film and a Cu film are used as the underlying oxide film and a wiring material, respectively. However, other materials such as a plasma CVD $Si_3N_4$ film and metals such as Al, Au, W and alloys thereof can also be used as far as a predetermined insulating performance and a predetermined wiring performance are satisfied. It is also possible to determine appropriately the depth of the wiring groove formed in the underlying oxide film and the thickness of the wiring metal.

In the polishing method of the present invention, the polishing agent of the present invention is applied to a working point on the semiconductor substrate mounted to the polishing apparatus in applying a CMP treatment to the semiconductor substrate. At the same time, a dispersant (ionic solution) is also applied to the working point on the semiconductor substrate.

Figure 5:
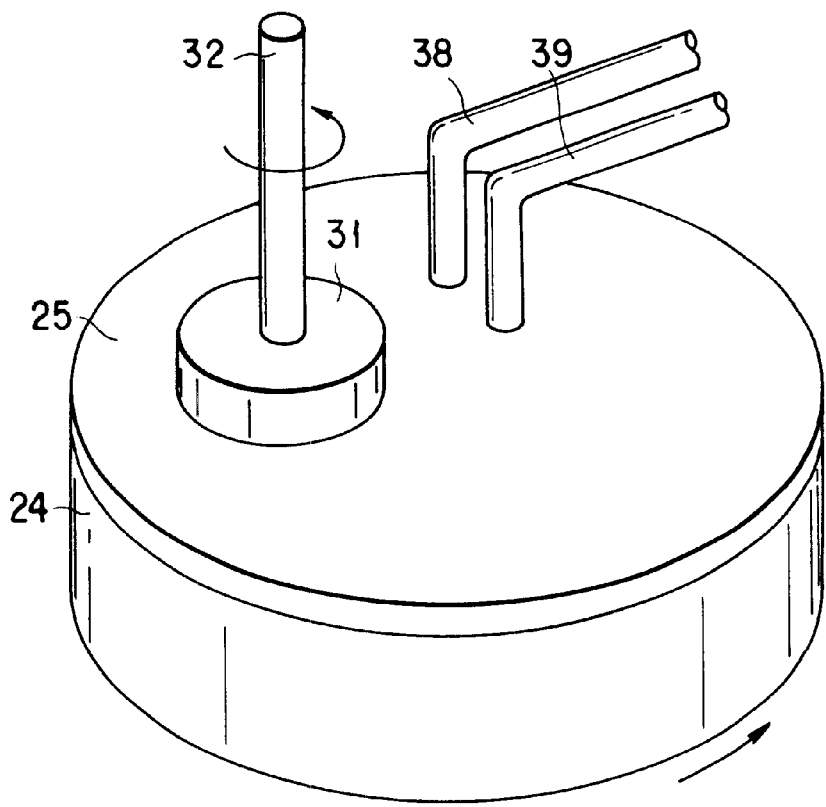
FIG. 5 is an oblique view for schematically explaining the polishing section.
Figure 6:
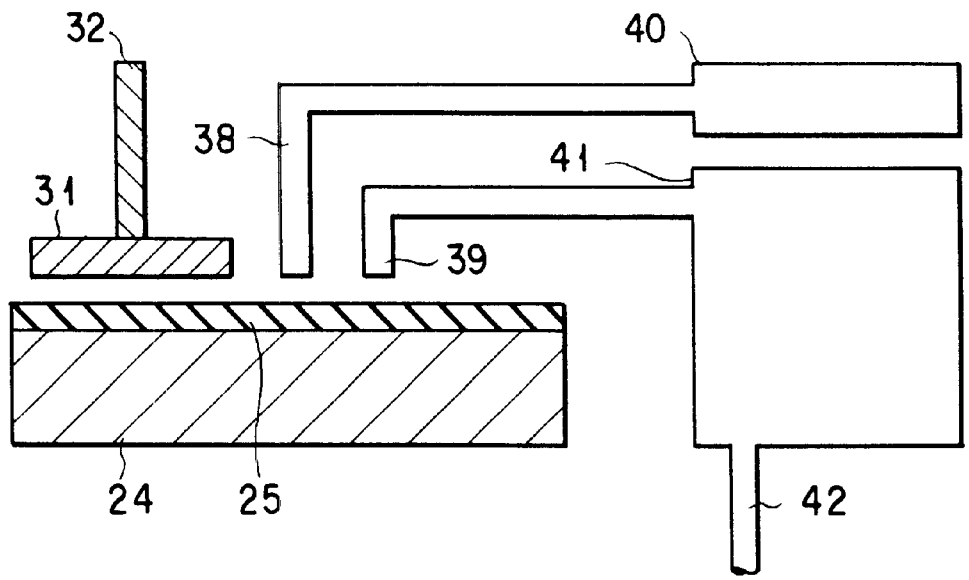
FIG. 6 is a cross sectional view for schematically explaining the polishing section.

Let us describe the polishing method of the present invention with reference to FIGS. 5 and 6.

Specifically, FIG. 5 is an oblique view schematically showing the polishing section of the polishing apparatus shown in FIG. 1 including the polishing disc, the suction disc and means for supplying a polishing agent onto the polishing disc. On the other hand, FIG. 6 is a cross sectional view schematically showing the polishing section included in the polishing apparatus shown in FIG. 1.

An ionic solution is used as a dispersant in performing the polishing treatment. Usefulness of pure water or ultra pure water is recognized in the manufacture of a semiconductor device. In preparing the pure water, the impurities such as ions, fine particles and microorganisms are removed substantially completely from the natural water to allow the resultant pure water to exhibit a resistivity of 5 to 18 MΩ·cm. The ultra pure water, which is prepared by removing highly efficiently the suspended substances and dissolved substances from the natural water by using an ultra pure water manufacturing apparatus, has a purity higher than that of the pure water. It should be noted that the electrical conductivity ρ of the pure water is lower than 10 μScm. On the other hand, the electrical conductivity ρ of the ultra pure water is lower than 0.055 μScm. A highly oxidizing acidic ionic solution and a highly reducing basic ionic solution, which are used in the manufacture of a semiconductor device, are obtained by hydrolyzing the pure water or the ultra pure water.

In the polishing apparatus used for the manufacture of a semiconductor device, a pipe for supplying a polishing agent onto a working point of the polishing cloth and another pipe for supplying an ionic solution can be arranged separately from each other. Specifically, it is possible to supply the polishing agent and the ionic solution such that the polishing agent is diluted with the ionic solution at the working point of the semiconductor substrate.

The polishing apparatus shown in FIG. 5 comprises the polishing disc 24 having a driving shaft (not shown) joined to the central portion thereof via a polishing disc receptacle (not shown). A polishing cloth 25 for polishing the substrate such as a semiconductor wafer is stretched over the polishing disc 24. The polishing cloth 25 is formed of, for example, a foamed polyurethane or an unwoven fabric of polyurethane. The driving shaft is rotated by a motor so as to rotate the polishing disc receptacle and the polishing disc 24. The semiconductor wafer is held by vacuum suction by the suction disc 31 provided with a suction cloth (not shown) such that the wafer is positioned to face the polishing cloth 25. The suction disc 31 is jointed to the driving shaft 32, which is moved up and down. As a result, the semiconductor wafer held by the suction disc 31 is pressed against or moved away from the polishing cloth 25 in accordance with the vertical movement of the driving shaft 32.

In polishing a semiconductor wafer, the polishing agent of the present invention is supplied from a polishing agent tank 40 onto the polishing cloth 25 through a polishing agent supply pipe 38. At the same time, an ionic solution formed in an electrolytic vessel 41 is supplied onto the polishing cloth 25 through an ionic solution supply pipe 39. Therefore, the nozzles at the tips of the polishing agent supply pipe 38 and the ionic solution supply pipe 39 are arranged above the polishing cloth 25 and in the vicinity of the suction disc 31 supporting the semiconductor wafer.

The polishing agent and the ionic solution supplied through the supply pipes 38 and 39 are mixed with each other to dilute the polishing agent in the working point of the semiconductor wafer in contact with the polishing cloth 25. The supply pipes 38 and 39 are movable to optional points above the polishing cloth 25. An excess ionic solution formed in the electrolytic vessel 41 is discharged to the outside through a discharge pipe 42.

The ionic solution includes a basic ionic solution and an acidic ionic solution. An ionic solution having an optional pH value can be formed by arranging a solid electrolyte within the electrolytic vessel and electrolyzing pure water or ultra pure water, which does not contain electrolytes, i.e., metal impurities, at a low voltage. Where the polishing rate is fluctuated during the polishing treatment in the case of using a basic ionic solution, the polishing treatment can be performed stably by controlling the pH value of the ionic solution. Specifically, the pH value of the ionic solution is controlled on the basic side in order to increase the polishing rate and is controlled on the neutral side in order to decrease the polishing rate. Likewise, where the polishing rate is fluctuated during the polishing treatment in the case of using an acidic ionic solution, the polishing treatment can be performed stably by controlling the pH value of the ionic solution. Specifically, the pH value of the ionic solution is controlled on the acidic side in order to increase the polishing rate and is controlled on the neutral side in order to decrease the polishing rate.

Let us describe the silica particles contained in the polishing agent of the present invention with reference to FIGS. 7 to 10.

Specifically, FIG. 7 is a cross sectional view schematically showing a cross section of a semiconductor substrate subjected to a CMP treatment. On the other hand, FIGS. 8 to 10 are graphs showing the changes in the polishing characteristics relative to the abrasive grain contents of the polishing agent.

To be more specific, FIG. 8 is a graph showing the relationship among the silica (abrasive) concentration, the polishing rate (nm/min), and the uniformity (1σ%) of the polished film. Curve 101 in the graph denotes the polishing rate, with curve 102 denoting the uniformity of the polished film. FIG. 9 is a graph showing the relationship between the silica concentration and the dishing amount (depth nm). Further, FIG. 10 is a graph showing the relationship between the silica concentration and the thinning amount (depth run).

FIG. 7 shows that a polycrystalline silicon is buried in a trench formed in a semiconductor substrate. In forming the structure shown in FIG. 7, a silicon nitride ($Si_3N_4$) film 2 is deposited on a silicon semiconductor substrate 1, followed by forming an aperture of a predetermined size in a predetermined position of the silicon nitride film 2. Then, a trench 5 is formed in the semiconductor substrate 1 by using the resultant silicon nitride film 2 as a mask, followed by depositing a polycrystalline silicon film 12 on the silicon nitride film 2 and within the trench 5. The polycrystalline silicon film 12 thus deposited is polished by a CMP method. In this polishing step, the silicon nitride film 2 is used as a stopper. It follows that the silicon nitride film 2 is exposed to the outside and the polycrystalline silicon film 12 is buried in the trench 5.

During the CMP treatment, the polycrystalline silicon film 12 and the silicon nitride film 2 tend to be over-etched to form a dish-shaped recess 7 around the trench 5. The largest over-etching amount of the silicon nitride film at the periphery of the trench 5 is called the "thinning amount (t)". Likewise, the largest over-etching amount of the polycrystalline silicon film in the center of the trench 5 is called the "dishing amount (d)". As shown in FIGS. 8 to 10, the polishing rate is increased with increase in the silica concentration (wt %), reaching a peak at a point where the silica concentration is about 7.5%. On the other hand, the uniformity is substantially constant until the silica concentration is increased to reach about 5%, and gradually diminished (uniformity is improved) to reach a peak at the silica concentration of about 7.5% by weight. However, the dishing amount and the thinning amount are increased with increase in the silica concentration so as to increase the recess. As a result, it is impossible to perform an accurate polishing. In view of these contradictory characteristics, it is desirable to set the concentration of the silica particles contained in the polishing agent of the present invention at 7.5% by weight or less, preferably 5% by weight or less, particularly 5% by weight.

In the polishing method of the present invention, it is possible to use a polishing agent differing in composition from the polishing agent of the present invention in combination with the polishing agent of the present invention. In this case, the polishing agent of the present invention is supplied onto the semiconductor wafer on the polishing disc through a nozzle, and the other polishing agent is supplied through another nozzle. For example, a slurry prepared by stirring a mixture consisting of silica particles as abrasive, water as a solvent and piperazine is supplied from a first polishing agent nozzle, and a slurry of the present invention is supplied from a second polishing agent nozzle.

Some examples of the present invention will be described in the following. Needless to say, the present invention is not limited at all by the following Examples.

EXAMPLE 1

Prepared was 100L (liters) of an aqueous solution containing 0.56% by weight of hydroxyethyl cellulose available on the market, which is hereinafter referred to as liquid I. Liquid I had a viscosity of 217 cP measured at 25° C. by using a B-type rotational viscometer and a pH value of 6.5 measured at 25° C. by using a pH meter.

Then, AMBERLITE MB-2 (trade name of a mixture of an H-type ion exchange resin and an OH-type ion exchange resin manufactured by Organo Inc.) was loaded in a cylinder having an inner volume of 10L, followed by allowing 50L of liquid I to flow upward through the cylinder at a flow rate of 1 L/min. About 10L of the liquid flowing first out of the cylinder was discarded and the succeeding 30L of the liquid flowing out of the cylinder was fractionated as liquid II. The pH value of liquid II was found to be 4.4. Also, the solid concentration, which was measured by drying liquid II at 100° C., was found to be 0.56% by weight.

In the next step, 2.4 kg of triethanolamine having a purity of at least 99% and a vapor pressure at 20° C. of 1.3 Pa or less, was added to 20 kg of liquid II, and the resultant mixture was mixed uniformly so as to prepare liquid III. Incidentally, a purity test was applied to the amine, finding that the concentration of any of the metal elements and anions other than OH ion was found to be not higher than 0.1 ppm. Na and K were analyzed by an atomic-absorption spectroscopy. The metal elements other than Na and K were analyzed by an CP method. Further, anions were analyzed by an ion chromatography method.

Added to liquid III were 4.8 kg of colloidal silica of a high purity as abrasive, which was prepared by hydrolyzing alkoxy silane used as a raw material, and 20.8 kg of pure water, and the resultant mixture was sufficiently stirred so as to prepare liquid IV. When observed with an electron microscope, at least 99% of the colloidal silica particles were found to have a particle diameter falling within a range of between 35 nm and 65 nm. A purity analysis was also applied to the colloidal silica, with the result that the metal element concentration in terms of silica was not higher than 0.1 ppm in any of the samples.

Further, liquid IV was filtered through a mesh of 6 $\mu$m so as to prepare a final polishing agent. The properties of the polishing agent at 25° C. were found to include a pH value of 10.12, a viscosity of 21 cP and a specific gravity of 1.067. Also, an impurity analysis was applied to the polishing agent, with the result as shown in Table 1.

As apparent from Table 1, where an ion exchange treatment was performed, the concentration of any of the alkali metal elements, other metal elements and typical anions was not higher than 0.1 ppm.

As apparent from the experimental data, it was possible to prepare a final polishing agent containing an alkali metal element in an amount not larger than 1.2 ppm, which is an upper limit calculated by the formula given previously on the basis that the concentration of the water-soluble cellulose is 0.23% by weight, by using a water-soluble cellulose refined by using an H-type ion exchange resin and an OH-type ion exchange resin, and strictly selected water-soluble amine and silica of a high purity.

The properties of the polishing agent thus prepared were examined. Specifically, a polishing test of a silicon wafer was conducted by using the polishing agent thus prepared and a polishing apparatus available on the market. An non-woven type pad was used in this polishing test. In the polishing test, a solution prepared by diluting the polishing agent with pure water such that the volume of the dilute solution was 5 times as large as the polishing agent before dilution was supplied onto the polishing pad at a rate of 200 mL/min so as to polish a 6-inch silicon wafer under a load of 200 g/cm$^2$ and a rotating speed of the disc of 25 rpm.

In order to examine the preservation capability of the polishing agent, about 50L (liters) of a dilute polishing agent was prepared by diluting the original polishing agent with pure water to make the volume of the dilute polishing agent 5 times as large as the volume of the original polishing agent. A polishing test was conducted under the conditions described above by using the dilute polishing agent 1 day, 3 days, 7 days, 14 days and 20 days after preparation so as to measure the polishing rate for each dilute polishing agent. The dilute polishing agent was left within a container except the time when the dilute polishing agent was actually used for the polishing operation. Table 2 shows the results.

Also, a purity analysis was applied to the wafer surface after washing of the wafer subjected to the polishing treatment. Table 3 shows the results.

Further, in order to examine the non-uniformity of the polishing agents among lots, 5 kinds of polishing agents were prepared by preparing hydroxyethyl cellulose as in Example 1, except that used were 5 different lots of hydroxyethyl cellulose.

The pH values and polishing rates of the resultant polishing agents were measured, with the results as shown in Table 4. As apparent from Table 4, the non-uniformity of the pH values of the polishing agents, which were 10.1 to 10.2, was very small. Also, the other properties were found to be substantially constant. Concerning the polishing rate, a difference among lots of the cellulose was found to be negligibly small.

EXAMPLE 2

A polishing agent was prepared as in Example 1, except that an ammonia water having a vapor pressure at 20° C. of 483 to 837 kPa was used in place of triethanolamine used in Example 1. Also, various tests were conducted as in Example 1.

The reproducibility of the polishing rate was measured as in Example 1, with the results as shown in Table 2. The properties of the polishing agent measured at 25° C. included a pH value of 10.2, a viscosity of 11.5 cP and a specific gravity of 1.059.

As apparent from Table 2, the polishing rate is rendered somewhat lower than that in Example 1, if the polishing agent containing ammonia having a high vapor pressure is preserved for a longer time.

As apparent from Examples 1, 2 and comparative examples, the polishing agent of the present invention has been found to be capable of markedly improving the purity of the polishing agent and the purity of the wafer after the polishing treatment by increasing the purity of the water-soluble cellulose. Clearly, the polishing agent of the present invention is useful not only as a final polishing agent for wafers but also as a polishing agent of a device.

Also, as apparent from Example 1, an excellent polishing agent satisfactory in preservation capability and capable of performing a stable polishing treatment can be obtained by using a water-soluble amine having a vapor pressure at 20° C. of 133 Pa or less.

COMPARATIVE EXAMPLE 1

A polishing agent was prepared as in Example 1, except that liquid I before treatment with ion exchange resins was used in place of liquid B.

A purity analysis was applied to the resultant polishing agent as in Example 1, with the results as shown in Table 1.

Also, the purity of the wafer after the polishing treatment was measured as in Example 1, with the results as shown in Table 3. Incidentally, the properties of the polishing agent measured at 25° C. included a pH value of 9.95, a viscosity of 23 cP and a specific gravity of 1.065.

In the polishing agent of Example 1, the concentration of the water-soluble cellulose is 0.23% by weight. Therefore, the upper limit in the content of the alkali metal element, which is calculated by the formula described previously, is 1.2 ppm. On the other hand, the content of the alkali metal element in the polishing agent of Comparative Example 1 was 3.5 ppm.

Five kinds of polishing agents were prepared by using 5 different lots of hydroxyethyl cellulose as in Example 1, except that liquid I before treatment with ion exchange resins was used for preparing the polishing agents.

The polishing rate and the pH value of the polishing agents thus prepared were measured, with the results as shown in Table 4. It has been clarified from the experimental data given in Table 4 that the contents of the alkali metal elements and the anionic impurities were much higher than the upper limits calculated based on the formula given previously.

Also, a large non-uniformity was found in the pH values of the polishing agents, which ranged between 9.7 and 10.4, supporting that the polishing agent is poor in reproducibility.

A large non-uniformity was also found in the polishing rates. To be more specific, since the lots of the polishing agents differed from each other in the cationic and anionic impurity concentrations in the cellulose used, the pH values of the polishing agents were non-uniform in the cases where the cellulose was not refined. As a result, it has been found that non-uniformity in the polishing performance (polishing rate) is brought about.

TABLE 1

|  | Example 1 (ppm) | Comparative Example (ppm) |
| --- | --- | --- |
| Na | <0.1 | 3.5 |
| K | <0.1 | <0.1 |
| other metals | <0.1 | <0.1 |
| $NO_3$ | <0.1 | 35.3 |
| $PO_4$ | <0.1 | 7.9 |
| other anions | <0.1 | 0.3 |

TABLE 2

|  | Example 1 (nm/min) | Example 2 (nm/min) |
| --- | --- | --- |
| initial | 185.5 | 175.4 |
| 1 day later | 185.7 | 171.9 |
| 3 days later | 185.3 | 166.3 |
| 7 days later | 184.4 | 160.6 |
| 14 days later | 184.8 | 151.8 |
| 20 days later | 184.1 | 92.9 |

TABLE 3

|  | initial values ($10^{10}$ atms/cm$^2$) | Example 1 ($10^{10}$ atms/cm$^2$) | Comparative Example ($10^{10}$ atms/cm$^2$) |
| --- | --- | --- | --- |
| Na | 2.0 | <2.0 | 13 |
| K | <0.2 | 0.25 | 0.33 |
| Fe | <0.3 | <0.3 | <0.3 |

TABLE 4

| | pH of polishing agent | | polishing rate (nm/min) | |
| --- | --- | --- | --- | --- |
| lot | Example 1 | Comparative Example | Example 1 | Comparative Example |
| 1 | 10.12 | 9.95 | 185.5 | 172.8 |
| 2 | 10.13 | 10.39 | 184.4 | 188.5 |
| 3 | 10.16 | 10.01 | 185.5 | 177.5 |
| 4 | 10.12 | 10.20 | 185.3 | 183.0 |
| 5 | 10.14 | 9.73 | 186.7 | 170.2 |

What is claimed is:

1. A polishing agent comprising; abrasive silica particles, water, and a water-soluble cellulose purified to reduce alkali metal impurities, wherein the polishing agent comprises C % by weight of the water-soluble cellulose and an alkali metal impurity of about 5C ppm or less, and further wherein the water-soluble cellulose is purified of alkali metal prior to its incorporation into the polishing agent.

2. The polishing agent according to claim 1, wherein the concentration (C) of the water-soluble cellulose is 0.05 to 4% by weight.

3. The polishing agent according to claim 1, wherein the silica grain content is 0.1 to 50% by weight.

4. The polishing agent according to claim 1, which further comprises a pH controller.

5. The polishing agent according to claim 4, wherein said pH controller exhibits a vapor pressure at 20° C. of 133 Pa or less.

6. The polishing agent according to claim 4, wherein said pH controller consists of a water-soluble amine.

7. The polishing agent according to claim 6, wherein the pH controller controls the pH value of the polishing agent at 8 to 11.

8. A polishing agent according to claim 7, wherein a pH of the polishing agent is 10 to 11.

9. A method of polishing a semiconductor wafer, comprising:

forming a groove portion in a surface of a semiconductor substrate;

forming an insulating film on the surface of the semiconductor substrate, including the grooved portion; and subjecting the semiconductor substrate to a chemical mechanical polishing step by contacting a polishing agent of claim 1 with the insulating film.

10. The polishing method according to claim 9, wherein a dispersant is supplied together with the polishing agent onto the film to be polished, which is formed on the semiconductor wafer.

11. The polishing method according to claim 10, wherein said dispersant is selected from the group consisting of an ionic solution and pure water.

12. A method of polishing a semiconductor wafer, comprising:

subjecting a polishing surface of a semiconductor wafer sliced from an ingot to a semiconductor wafer, the polishing agent comprising abrasive silica particles, water, and a water-soluble cellulose purified to reduce alkali metal impurities, wherein the polishing agent contains C % by weight of the water-soluble cellulose and an alkali metal impurity of about 5C ppm or less, and further wherein the water-soluble cellulose is purified of alkali metal prior to its incorporation into the polishing agent.

13. The polishing agent according to claim 1, wherein the water-soluble cellulose is purified to remove alkali metal impurities by contacting the water-soluble cellulose with at least one H-type ion exchange resin and at least one OH-type ion exchange resin.

14. The polishing method according to claim 12, wherein the water-soluble cellulose is purified to remove alkali metal impurities by contacting the water-soluble cellulose with at least one H-type ion exchange resin and at least one OH-type ion exchange resin.

15. A polishing method according to claim 13, wherein a pH of the polishing agent is 10 to 11.

16. A polishing method according to claim 9, wherein a pH of the polishing agent is 10 to 11.

* * * * *